(12) United States Patent
Christian et al.

(10) Patent No.: US 12,158,372 B2
(45) Date of Patent: Dec. 3, 2024

(54) CONCURRENT LASER CLEANING AND SPECTROSCOPIC CLEANLINESS MONITORING

(71) Applicant: FEI Company, Hillsboro, OR (US)

(72) Inventors: Joseph Christian, Portland, OR (US); Jorge Filevich, Portland, OR (US)

(73) Assignee: FEI Company, Hillsboro, OR (US)

( * ) Notice: Subject to any disclaimer, the term of this patent is extended or adjusted under 35 U.S.C. 154(b) by 376 days.

(21) Appl. No.: 17/833,670

(22) Filed: Jun. 6, 2022

(65) Prior Publication Data
US 2023/0393074 A1  Dec. 7, 2023

(51) Int. Cl.
*G01J 3/44* (2006.01)
*G01J 3/02* (2006.01)
*G01N 21/65* (2006.01)
*G01N 21/94* (2006.01)
*H01J 37/28* (2006.01)

(52) U.S. Cl.
CPC ............... *G01J 3/44* (2013.01); *G01J 3/0291* (2013.01); *G01N 21/65* (2013.01); *G01N 21/94* (2013.01); *H01J 37/28* (2013.01)

(58) Field of Classification Search
CPC .......... G01J 3/44; G01J 3/0291; G01N 21/65; G01N 21/94; H01J 37/28
See application file for complete search history.

(56) References Cited

U.S. PATENT DOCUMENTS

| | | | |
|---|---|---|---|
| 2006/0250147 A1* | 11/2006 | Morita | G01N 23/2251 324/754.21 |
| 2020/0411282 A1 | 12/2020 | Straw et al. | |
| 2023/0038908 A1* | 2/2023 | Wang | C23C 16/4401 |

OTHER PUBLICATIONS

Lapin, "Protein Holography," *Nature Methods*, vol. 14, No. 3, p. 227 (Mar. 2017).
Longchamp et al., "Imaging Proteins at the Single-Molecule Level," *PNAS*, vol. 114, No. 7, pp. 1474-1479 (Feb. 2017).
Mutus et al., "Low Energy Electron Point Projection Microscopy of Suspended Graphene, the Ultimate Microscope Slide," arXiv:1102.1758v2, pp. 1-16 (Feb. 2011).
Pham, "Cleaning of Graphene Surfaces by Low-Pressure Air Plasma," *RoyalSociety Open Science*, 6 pages (Apr. 2018).
Tripathi et al., "Cleaning Graphene: Comparing Heat Treatments in Air and in Vacuum," arXiv:1704.08038v14, pp. 1-5 (Apr. 2017).

* cited by examiner

*Primary Examiner* — Nicole M Ippolito
(74) *Attorney, Agent, or Firm* — Klarquist Sparkman, LLP

(57) ABSTRACT

Methods and apparatus are disclosed for concurrent cleaning and cleanliness monitoring of a sample such as a substrate for electron point projection microscopy. A graphene sample is illuminated by a laser. Raman scattering from contaminants generates secondary light which is analyzed by spectrometer. Based on Raman scattering analysis, sample cleanliness is determined. Cleaning can be dynamically terminated based on achieving a target cleanliness level or based on prediction thereof. Variations and additional applications are disclosed.

25 Claims, 10 Drawing Sheets

CONCURRENT LASER CLEANING AND SPECTROSCOPIC CLEANLINESS MONITORING

FIELD

This disclosure pertains to cleaning a sample or substrate.

BACKGROUND

Low-energy electron point projection microscopy has been gaining interest for imaging proteins and other macromolecules. The macromolecule can be supported on a substrate during imaging, and image quality or fidelity can be compromised by the presence of contaminants on the substrate. Contaminants can make it difficult or impossible to identify an object of interest in the image. Cleaning by conventional techniques can be cumbersome to verify, can be unpredictable, or can take a long time. Particularly, some conventional techniques lack a capability for in situ cleanliness monitoring. Accordingly, there remains a need for improved technology for cleaning, with in situ monitoring, suitable for graphene or other substrate materials.

SUMMARY

Apparatus and methods are disclosed for spectroscopic monitoring of sample cleanliness during cleaning. In examples, a laser can perform cleaning and Raman scattering of the laser light can be measured to obtain an indication of cleanliness.

In one aspect, the disclosed technologies can be implemented as an apparatus incorporating a laser, a spectrometer, and a controller. The laser is arranged to irradiate a sample with incident light to clean the sample and generate secondary light. The spectrometer is positioned to receive the secondary light and configured to resolve the secondary light to obtain spectral intensity data. The controller is configured to acquire the spectral intensity data from the spectrometer, and to analyze the spectral intensity data to determine a value indicating cleanliness of the sample.

In another aspect, the disclosed technologies can be implemented as a method. A beam is directed onto a surface of a sample to clean the surface and to generate secondary radiation. Spectral intensity data of the secondary radiation is obtained, and is analyzed to establish a value indicating cleanliness of the sample surface.

In a further aspect, the disclosed technologies can be implemented as a system incorporating first, second, and third means. The first means is for cleaning a sample by irradiation and causing secondary radiation to be generated at the sample. The second means is for determining one or more spectral intensities of the secondary radiation, and the third means is for determining cleanliness of the sample from the one or more spectral intensities.

The foregoing and other objects, features, and advantages of the disclosed technologies will become more apparent from the following detailed description, which proceeds with reference to the accompanying figures.

DETAILED DESCRIPTION

Introduction and Overview

Structural analysis of single macromolecules using electron holography holds great promise in biology, drug discovery, and material science.

Electron Point Projection Microscopy

Figure 1:
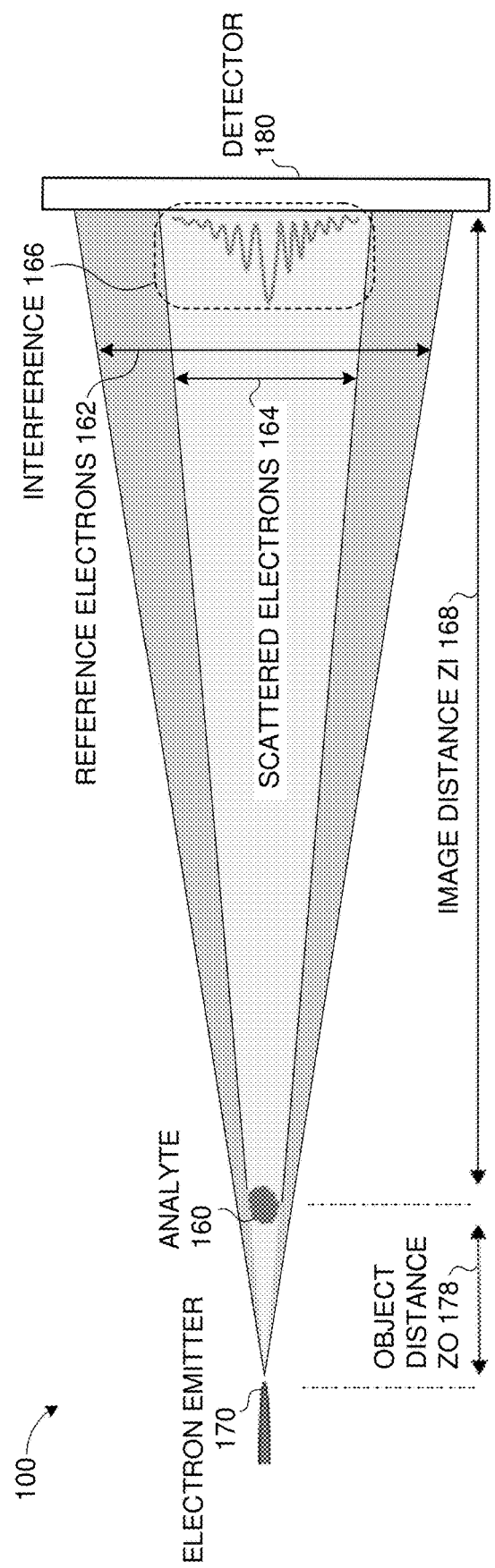
FIG. 1 is a diagram of a first example electron holography procedure to which the disclosed technologies can be applied.

FIG. 1 is a diagram 100 illustrating holography of single analyte particle 160 using an electron point projection microscope. The microscope incorporates electron emitter 170, which can be a cold field emission (CFE) source, and an imaging detector 180, which can be a CMOS or microchannel array. The electrons emitted 162 and 164 from the electron emitter 170 can, once they reach the detector 180, either contain amplitude and phase information from the analyte 160 or be a reference electron that has not been scattered by the analyte. The interaction of these types of electrons form a phase sensitive interference pattern 166 that is measurable and recordable by the detector 180 as intensity fringes. This phase sensitive interference pattern can be a hologram of analyte 160.

At an energy of 100 eV, an electron has a de Broglie wavelength of about 0.1 nm, which is comparable to atomic dimensions and interatomic spacings in common analytes 160. Moreover, the electron point projection microscope offers considerable magnification. To illustrate, with object distance ZO 178 of about 100 nm, and image distance ZI 168 of about 1 cm, a magnification of $ZI/ZO=10^5$ can be practical, and an 0.1 nm atomic feature can be magnified to 10 µm, suitable for image acquisition and feature resolution with available detectors 180.

Figure 2:
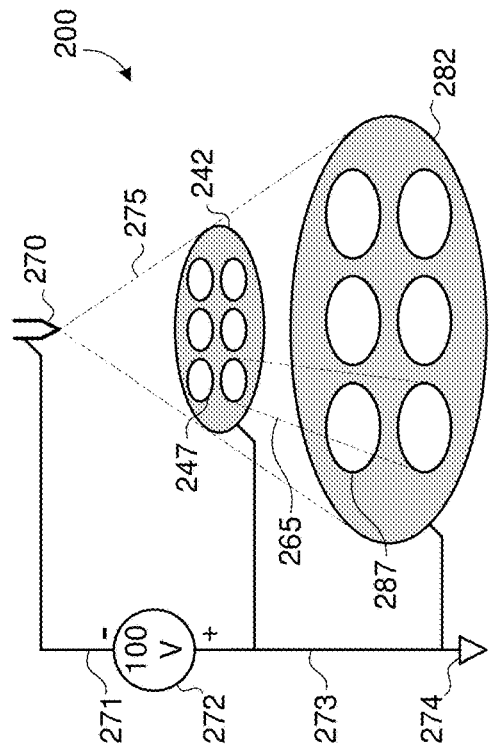
FIG. 2 is a diagram of a second example procedure to which the disclosed technologies can be applied.

FIG. 2 is a diagram 200 of a second example analytic procedure, in particular simultaneous independent imaging of an array of analyte particles. Substrate 242 can have an array of windows 247, and can be placed in the field of view of electron emitter 270. A fraction of these windows can be occupied by a single analyte particle each. Conical electron beam 275 can irradiate the occupied substrate 242, and a transmitted electron beam 265 can include a mix of scattered and reference electrons as described in context of FIG. 1.

Notably, the scattering cones of the several windows can be kept distinct, so that each circular patch 287 in image 282 can contain an interference pattern of a respective window 247 on substrate 242. Thus, analyte particles in each window can be imaged independently, in parallel, to obtain an enhancement in throughput for the point projection microscopy technique.

Also shown in FIG. 2 are electrical connections. Object plane 242 and detector plane 282 can be tied to ground 274 by wiring 273, while voltage source 272 can apply an accelerating voltage between electron emitter 270 and object plane 242 through wiring 271.

Utility of Electrically Conductive Substrate

In the absence of other conductive structures, equipotential surfaces will have varying shapes between electron emitter 170 and detector 180. Particularly equipotential surfaces closer to electron emitter 170 can have shapes conforming to the shape of a surface of electron emitter 170, while equipotential surfaces closer to detector 180 can be nearly planar. Because of the proximity of analyte 160 to electron emitter 170, the equipotential lines proximate to analyte 160 can be strongly curved, and the attendant electric field lines (electric field being the gradient of the electric potential) can vary in direction, leading to aberrations in electron paths between analyte 160 and detector 180, and degradation of image quality. Additionally, dielectric properties of analyte 160 can further distort the associated electric fields, further degrading image quality.

Introduction of an electrically conductive substrate 242 at the plane of an analyte can alleviate these problems. Particularly, having a plane substrate 242 at the same electric potential as detector plane 282 can provide a field-free drift region between analytes (supported on substrate 242) and image plane 282. The field-free drift region can provide superior imaging quality, as compared to a non-conductive substrate which is likely to experience field distortions and image degradation as described above. In other examples, the electric potentials at analyte plane 242 and image plane 282 can be set to provide a uniform accelerating electric field in the drift region, which can also provide good image quality.

While the disclosed technologies can be applied electrically conductive substrates for electron point projection microscopy, the innovations are not so limited. In other applications, the disclosed technologies can also be beneficially applied to clean electrically non-conductive samples.

Substrate Cleanliness

Graphene is an attractive electrically conductive support material. Graphene monolayer and bilayers can have electron transparency greater than 70% or 50%, respectively, at typical electron energies. That is, the majority of electrons can pass through a thin graphene layer without interaction. At the same time, electrical conductivity of $1-2 \times 10^6$ S/m is about a factor of 40 below the $60 \times 10^6$ S/m conductivity of copper, but still high enough to provide ground plane effects as discussed in context of FIG. 2.

Graphene foils can be produced by deposition on a metal substrate, and can be transferred to a target substrate in a four-step process: (1) PMMA application onto the graphene, (2) etch removal of the original metal substrate, (3) transfer to the target substrate, and (4) etch removal of the PMMA backing. This transfer process can leave PMMA or solvent residues, or other contaminants, on the transferred graphene.

Other candidate 2-D materials (e.g. hexagonal boron nitride) can be manufactured using different techniques, but can also suffer from contamination. Presence of any contaminant proximate to an analyte can introduce scattered electrons not associated with the analyte, which can introduce noise into an acquired hologram and can confound structural analysis of the analyte.

Conventional techniques for cleaning suitable materials can be hit or miss as to whether the substrate is sufficiently free of contaminants. In one aspect, the challenge can arise because some 2-D materials, whether graphene or another material, can be fragile and susceptible to damage. Robust cleaning techniques used for bulk materials, e.g. using high levels radiation or heat, may not be suitable, and gentler techniques may be required. In another aspect, some cleaning techniques can be ruled out because dislodging or decomposing a contaminant particle (e.g. residual PMMA on graphene) can also etch the sample being cleaned.

In order to verify cleanliness after a period of cleaning, some conventional approaches require cumbersome transport of a graphene or other sample from one cleaning station to another equipment station for assessment of cleanliness. Aside from the time required, transportation operations can lead to further contamination of the sample. Other approaches use the electron point projection microscope itself as a basis for verifying cleanliness. That is, if a good quality hologram is obtained, then the graphene substrate can be deemed to have been clean. If the hologram is poor quality, then the hologram can be discarded, and another attempt made to obtain a clean substrate. Such a trial and error approach is prone to failed attempts and offers an unreliable workflow. A further approach has been to continue cleaning for a long time, so as to increase the likelihood that cleaning will meet a desired cleanliness level and subsequent holography will be successful. Although such an approach can reduce the risk of failure to an acceptable level, cleaning a sample which is already clean can waste time and resources. Still further, processes requiring changing equipment configurations (e.g. between process stages for cleaning monitoring) can run a risk of collision between an electron emitter tip and a sample (e.g. while refocusing an electron beam), which can damage the electron emitter, the sample, or both.

Overview of Disclosed Technology Example

The disclosed technologies overcome these and other problems through combined use of a beam for sample cleaning and for sample monitoring, where the beam parameters can be controlled to provide effective cleaning, adequate signal for cleanliness monitoring, and avoiding damage to the sample being cleaned.

In examples, a laser can irradiate the sample (e.g. graphene) to effect cleaning. Cleaning by laser light can occur through heating. Depending on the wavelength of irradiating light and the contaminant species, cleaning can occur by direct absorption of radiant light by contaminant particles, or indirectly via substrate heating and conduction therefrom. Heated contaminant particles can gradually volatilize, leading to a cleaned surface.

Some of the irradiating light can undergo Raman scattering by contaminant atoms or molecules, which can be received and analyzed using a spectrometer. A spectral intensity of a Raman peak can directly indicate an amount of contaminant present. Thus, cleaning can be accurately monitored and can be terminated based on reaching a target cleanliness level. By monitoring a trend in cleanliness, target cleanliness levels can be predictably reached even if such levels are below measurement noise levels. The disclosed technologies are not limited to Raman scattering of laser light. Other beams and measurable contaminant signatures can also be used, some examples of which are described herein.

Although disclosed examples refer to applications in electron point projection microscopy, the techniques are not so limited, and can be applied to cleaning thin foil or other samples in a wide range of material science, sensor, semiconductor, biology, or other applications.

Terminology

The usage and meaning of all quoted terms in this section applies throughout this disclosure unless clearly indicated otherwise or repugnant to the context. The terminology below extends to related word forms.

An "analyte" is a material species used as a sample for an analytic procedure. In some disclosed examples, the analytic procedure can be holographic imaging of an analyte using an electron point projection microscope. Non-limiting examples of analytes can include macromolecule such as lipids, nanotubes, nucleic acids, polymers, or proteins. Other analytic procedures can include delayering, electron backscatter analysis, electron microscopy, etching, imaging, mass spectrometry, material analysis, metrology, nanoprobing, spectroscopy, or surface preparation. Equipment used to perform analytic procedures is termed an "analytic instrument".

An "aperture" is a hole in a solid object providing a clear straight line path through the object, from one external surface of the object to an opposite external surface. A material having multiple apertures is dubbed "porous", and an aperture is sometimes termed a "pore".

A "beam" is a directional flow of particles or energy. Common beams of interest in this disclosure are light beams or ion beams, but the term is not limited thereto and, in variations, electron beams can also be used. Ion beams and electron beams are flows of ions or electrons respectively. A light beam is a flow of electromagnetic energy, which can be regarded as waves or as (particulate) photons. A beam can have finite extent transverse to its principal longitudinal direction of flow. A line joining the centroids of two or more transverse cross-sections of a beam is an "axis" of the beam.

As a verb, "clean" refers to reducing an amount of contaminant on or in a sample. As an adjective, "clean" can be used to describe a sample having an amount of contaminant below a predetermined threshold. "Cleanliness" is a parameter characterizing the amount of contaminant on or in a sample. Cleanliness can have a numerical value, which can vary directly or inversely as the amount of contaminant, or can have a logical value (e.g. clean or not clean).

The term "concurrent" can refer to first and second processes occurring over overlapping time durations—that is, the second process can begin at a same or later time as the first process, but before the end of the first process. Two, three, or more processes can be concurrent if there is a finite time interval over which all processes have begun and none have ended. The term "simultaneous" refers to two events or processes occurring at a same instant of time. Two, three or more events or processes can be simultaneous if there is at least one instant of time at which all the events or processes are occurring. Concurrent processes can be simultaneous, but that is not a requirement. To illustrate, three concurrent processes A, B, C, can occur one at a time in a temporal sequence A, B, C, A, B, C, A, B, C, . . . .

A "contaminant" is an undesirable material species on or in a sample. In some disclosed examples, contaminants on a graphene sample can include organic residues from a polymethyl methacrylate (PMMA) transfer procedure. A contaminant can adversely affect a downstream analytic process, e.g. by decreasing resolution or otherwise degrading an image performed using the sample. Examples of the disclosed technologies can measure an amount of contaminant present, and can concurrently clean the sample to remove the contaminant.

A "controller" is an electronic device coupled to one or more actuators to effect a change in a physical parameter, or coupled to one or more sensors to monitor a physical parameter. Some controllers can include a microprocessor which can be programmed to execute machine readable instructions. The descriptions herein of computing devices are generally applicable to such controllers. Such controllers can include additional electronic circuitry such as analog-to-digital converters (ADCs), digital-to-analog converters (DACs), switches, comparators, filters, or amplifiers. Other controllers can include analog circuitry without any microprocessor.

A "detector" is an apparatus for measuring a received signal, which can be in the form of light, an electrical signal, an electron beam. Detectors can incorporate photodiodes, complementary metal oxide semiconductor (CMOS) elements, charge coupled devices (CCD), microchannel plates, photomultipliers, or similar devices, singly or in arrays. Some detectors can detect amplitude and phase, e.g. for recording a hologram. Some detectors can be pixelated, and can form an image from a spatially distributed signal. However, a pixelated detector is not a requirement for forming an image. In other examples, the spatial variation of an image can be achieved e.g. by scanning a narrow or point beam across a sample (as in an SEM) or by moving a small detector across a spatially distributed signal. A detector can be part of an analytic instrument such as a spectrometer or an electron point projection microscope.

An "electron microscope" is a type of analytic equipment in which a sample is illuminated by an electron beam, and resulting particles or electromagnetic radiation are used to form a spatially resolved image. A scanning electron microscope (SEM) images a sample surface based on reflected, secondary, or backscattered particles or radiation from one or more surfaces of the sample. Some images disclosed herein are SEM images. An "electron point projection microscope" images a sample (e.g. an analyte) using a divergent electron beam and detecting diffraction or scattering from the edges of the sample. An electron microscope can include an electron source (sometimes, "electron emitter") and an imaging detector.

"Graphene" is a sheet form (sometimes dubbed "membrane") of carbon having thickness of one to ten atomic layers. Each layer includes a planar hexagonal lattice of carbon atoms. Graphene with exactly one such layer is termed "single-layer" or "monolayer". Graphene with exactly two such layers is termed "double-layer" or "bilayer". Various bilayer configurations including Bernal-stacked or twisted can be used.

A "hologram" is an image incorporating amplitude and phase information of interfering waves. The waves can be electromagnetic waves (e.g. light waves) or de Broglie waves of interfering electrons (e.g. in an electron point projection microscope).

An "image" is a two-dimensional representation of a parameter value over a region of interest of a sample. In examples, the region of interest can be an analyte volume, the image can be an electron hologram, and the parameter value can be amplitude and phase of scattered electrons, projected onto a detector plane.

"Intensity" refers to a received amount of particles or energy. Intensity can be quantified as power (e.g. Watts, W), as energy (e.g. Joules, J), as electromagnetic field amplitude (e.g. Volts per meter, V/m), or as dimensionless units (e.g. number of ions). Intensity can optionally be normalized from extensive to intensive units, e.g. per unit of time, area, solid angle, wavelength, frequency, or other similar units or combinations thereof.

The term "irradiate" refers to directing particles or energy (e.g. a beam) onto a physical object (e.g. a sample). In this disclosure, samples can variously be irradiated with light, electrons, or an analyte.

A "laser" is a source of coherent light. A laser can be pulsed or continuous wave ("CW").

As used herein, "light" refers to propagating electromagnetic energy having spectral content between about 30 THz (terahertz) and 3 PHz (petahertz). This frequency range corresponds to free-space wavelengths of about 100 nm to about 100 μm. Frequencies and wavelengths can be used interchangeably in this disclosure. As is common in the art, wavelengths refer to the free-space wavelength of the described light, even though the light may be propagating in a medium having refractive index n>1. Light is not limited to the visible portion of the electromagnetic spectrum (about 400 nm to 800 nm, "visible light"). In some embodiments, "infrared" (wavelength range 800 nm to 100 μm) or "near infrared" (wavelength range about 800 nm to 1400 nm) light can be used, for example from an 830 nm diode laser. Wavelengths of about 100 nm to 400 nm are dubbed "ultraviolet" and can also be used. "Coherent" light is light whose phase exhibits correlation across space ("spatial coherence") or time ("temporal coherence"). A laser commonly emits light with both spatial and temporal coherence; however, in general, spatial and temporal coherence can manifest independently of each other.

A "major surface" of a sample is a surface of the sample whose area is not substantially exceeded by any other surface of the sample. For convenience of description, samples are considered to have top and bottom major surfaces, with the bottom surface supported on a stage and the top surface exposed to one or more tools or beams.

"Noise" refers to an undesired constituent of a measurement. Noise can variously arise at a detector (e.g. shot noise or thermal noise at an electronic detector), at a signal source (e.g. quantization noise or other fluctuations in a light source or an electron source), at an object being measured (e.g. contaminants proximate to a protein analyte can introduce noise into a detected hologram), or elsewhere in a measurement channel. An amplitude of noise is sometimes termed a "noise level".

A "parameter" is an attribute or property of a physical system which can be measured or observed. A result of such measurement or observation is a "value" of the parameter. A parameter can also be an attribute or property of the physical system which can be controlled. In this context, a setting applied to the parameter is its value. A parameter can have one or more "values". While parameters often have numerical values, this is not a requirement, and some parameter values can be logical values (e.g. whether the parameter is above or below a threshold, or On or Off), strings (e.g. describing the parameter), or data structures (e.g. a spectrum of scattered light).

"Raman scattering" is inelastic scattering of light by a material. Particularly, the scattering event can be accompanied by a change in vibrational energy of a scattering atom or molecule. Because different materials have different vibrational energy states and, different transition energies between such states), the energy shift of Raman scattered light can be used to identify the scattering material, and to distinguish such scattering material from other proximate material species. Additionally, the intensity of Raman scattered light can be used to quantify an amount of the scattering material.

A "region of interest" (ROI) is a portion of a sample that includes a feature or structure that is the subject of analysis. The term ROI does not refer to any human interest.

The term "resolve" refers to distinguishing electromagnetic radiation of one wavelength (or one group of wavelengths) from other wavelengths.

A "sample" is a physical object upon which an analytic, manufacturing, or preparatory procedure is performed. A "substrate" is another physical object, distinct from the sample, upon which the sample is mounted for such procedure. In a sequence of operations, a sample on which one operation is performed can be a substrate for another operation. To illustrate, disclosed technologies can be used to prepare a graphene sample, mounted on a silicon nitride (SiN) substrate, by laser cleaning. Thereafter, holographic analysis can be performed on a protein sample deposited onto the graphene, now in the role of a substrate. The substrate for the protein sample can include both the graphene and the underlying SiN.

The term "scan" refers to a spatial traversal, and "traverse" refers to performing some act successively at a series of points or regions. Some scans in this disclosure are over a series of ROIs on a sample being cleaned. The ROIs can be defined by apertures in a substrate supporting the sample, and can be arranged along a straight or curved line, or spread over two dimensions of a major surface of the sample. A scan can be continuously moving, or can have a dwell time at each of multiple discrete locations. Whether a scan is continuous or discrete, the scan can be performed with uniform or variable speed. A scan over multiple ROIs can cover one entire ROI before moving to the next ROI. Alternatively, one scan line can traverse in an X direction across multiple ROIs before incrementing a Y coordinate for the next scan line, also performed across all of the multiple ROIs. Scans can be performed iteratively in multiple passes. A "pass" is a shortest (temporally) portion of a scan that traverses all points or ROIs of interest at least once.

A "source" is an apparatus configured to deliver material or energy. Exemplary sources describe herein include analyte sources, light sources, and electron sources. To illustrate, a light source can incorporate a pulsed or continuous wave laser and can generate light of one or more wavelengths. An exemplary analyte source can deliver a beam of ionized proteins onto a clean graphene sheet for subsequent imaging. Imaging can be performed using an electron beam generated by an electron source.

"Spectral intensity" is an amount of received light energy at a particular wavelength or frequency point of an electromagnetic spectrum. Spectral intensity can be measured or reported as W/Hz or similar intensive units, or can be integrated over a particular spectral line as W. Spectral intensity data can variously include: a maximum intensity value of a spectral peak corresponding to Raman scattering by a contaminant; an integrated value of power across the spectral width of the Raman scattering peak; or a spectrum including an array of intensity values for respective wavelengths at and away from Raman scattering peak(s).

A "spectrometer" is an instrument which can make a spectrally resolved measurement of received radiation. An optical spectrometer can distinguish and measure light of one or more wavelengths from light at other wavelengths. A particle spectrometer can distinguish and measure particles of particular energies. In varying examples, a spectrometer can sweep across wavelengths or energies, can perform Fourier transform analysis of a received signal, or can implement one or more stationary tuned filters (e.g. monochromator(s) or band pass filter(s)) to detect signal at a particular wavelength or energy, to within a measurement bandwidth.

A "termination condition" is a criterion which, when satisfied, is used as a basis for stopping an iterative or continuous process.

The terms "top," "bottom," "up," "down," "above," "below," "horizontal," "vertical," and the like are used for convenience, with respect to a common configuration in which an exposed major surface of a horizontal sample has an outward normal directed upward, e.g. the sample is accessible to process tools from above. "Transverse" refers to directions within or parallel to a major surface of the sample. One of ordinary skill will understand from this disclosure that a choice of actual orientation can be varied without departing from the scope of the disclosed technologies.

A "two-dimensional material" (also "2-D material") is a crystalline solid having a single layer of atoms. Non-limiting examples of materials available in 2-D form include graphene, graphyne, silicene, platinum, hexagonal boron nitride, nickel, melamine, or Ni3(HITP)2, a coordination complex of nickel with (2,3,6,7,10,11)-hexaaminotriphenylene (HITP). Some 2-D materials combine high transparency across the layer with high electrical or thermal conductivity within the layer.

First Example Apparatus

Figure 3:
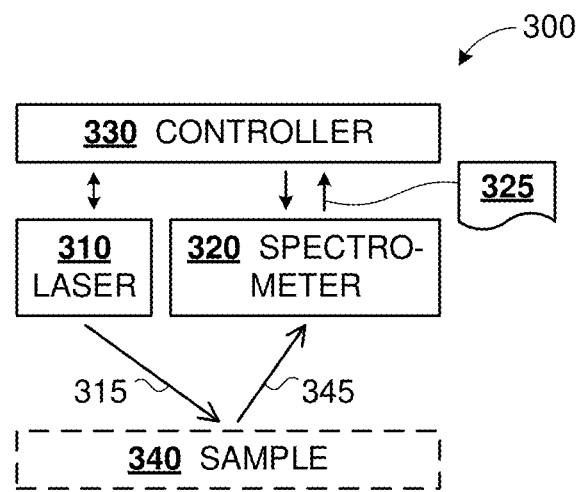
FIG. 3 is a block diagram of a first example apparatus with which the disclosed technologies can be implemented.

FIG. 3 is a block diagram of a first example apparatus 300. In this apparatus, laser 310 and spectrometer 320 can perform cleaning and monitoring of sample 340 under control of controller 330. Sample 340 is generally not part of apparatus 300, and accordingly is shown by a dashed outline. However, apparatus 300 can include a mount, translation stage, load lock, or other fixturing or handling devices (not shown) to assist in handling sample 340.

Laser 310 can be arranged to irradiate sample 340 with incident light 315. Incident light 315 can clean sample 340 and can stimulate generation of secondary light 345 from sample 340. In examples, a tunable diode laser 310 operating in the near infrared can be used. Values of spot size, average or peak power, wavelength, or continuous or pulsed operation (including pulse width and duty cycle) can be selected to provide discernible cleaning effect without damage to sample 340 or any underlying substrate (not shown). In some applications, laser power density can be gradually increased, from an initial low value, until a decreasing contaminant level is observed. In other applications, a damage threshold can be determined prior to cleaning, and the laser power density can be derated from the damage threshold by a predetermined amount. To illustrate, the laser power density can be set to 45-80% of the damage threshold. In some experiments, a CW 830 nm tunable diode laser 310 was used, with a power density 0.45-1.5 mW/μm$^2$, on a graphene sample supported by a porous SiN substrate.

Spectrometer 320 can be positioned to receive secondary light 345 and can be configured to resolve secondary light 345 to extract spectral intensity data 325. In varying examples, spectral intensity data 325 can include: a maximum intensity value of a spectral peak corresponding to Raman scattering by a contaminant; an integrated value of power across the spectral width of the Raman scattering peak; or a spectrum including an array of spectral intensity values both at and away from Raman scattering peak(s). Further, spectral intensity data 325 can include values for multiple spectral lines corresponding to a same or different contaminant species, or can include baseline or noise values of spectral intensity in one or more spectral regions away from any peak associated with Raman scattering by a contaminant.

Controller 330 can be configured to acquire spectral intensity data 325 from spectrometer 320, and can analyze spectral intensity data 325 to obtain a value indicating cleanliness of sample 340. In varying examples, the cleanliness value can include: an intensity of a peak (line) associated with Raman scattering by a contaminant; a combination of intensity values at two or more such peaks (lines); a combination of one or more intensity values with a baseline or noise level; or a complement of such an intensity value. Thus, in some examples, the value indicating cleanliness can vary directly with amount of contaminant, so that the value is lower for a cleaner sample. In other examples, the value indicating cleanliness can vary inversely with amount of contaminant, so that the value is higher for a cleaner sample.

Numerous extensions or variations of apparatus 300 can be implemented within the scope of the disclosed technologies. Light 315 can be visible or infrared light. The value indicating cleanliness can be based on the intensity of a spectral peak associated with a contaminant present on a surface of sample 340 or within sample 340. Controller 330 can be configured to control or monitor laser 310, including: turning laser 310 on or off, controlling or monitoring wavelength or power of emitted light 315, or controlling or monitoring of other parameters of laser 310 or emitted light 315. Controller 330 can be configured to terminate a cleaning procedure upon determination that a target cleanliness of sample 340 has been achieved, or a termination condition has been met.

In further examples, apparatus 300 can include a source (not shown) configured to deposit an analyte on the cleaned sample. Apparatus 300 can include an electron emitter configured to irradiate the deposited analyte with an electron beam and a detector positioned to record a hologram formed by interaction between the electron beam and the analyte.

Second Example Apparatus

Figure 4:
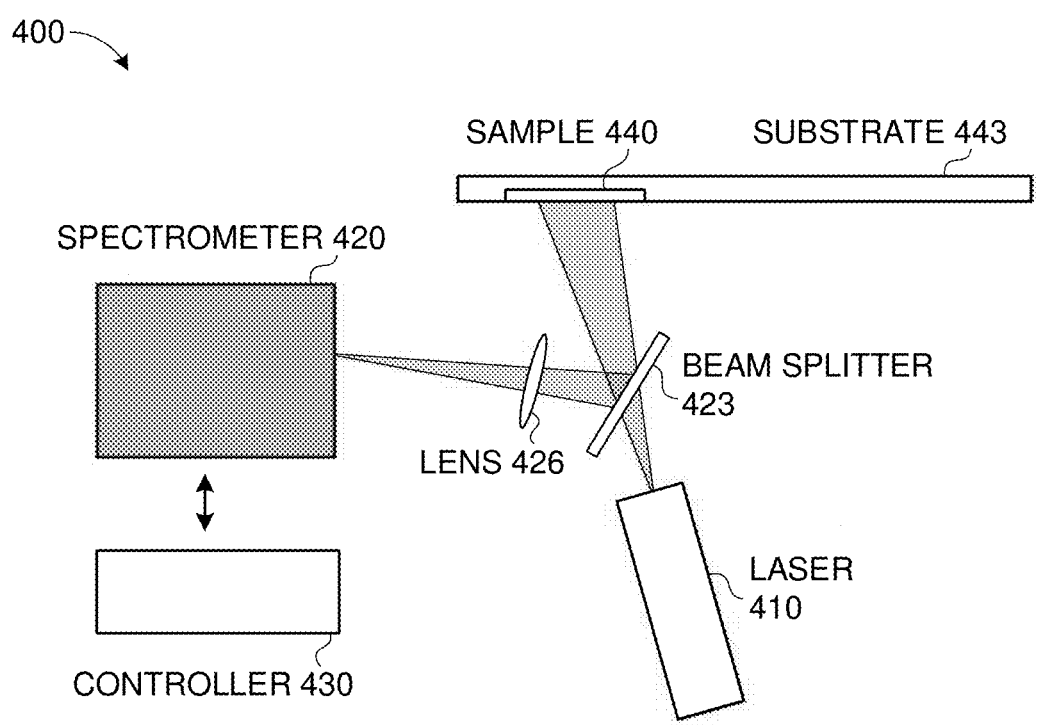
FIG. 4 is an optical diagram of a second example apparatus with which the disclosed technologies can be implemented.

FIG. 4 is an optical diagram 400 of a second example apparatus. Laser 410 can be positioned to illuminate sample 440, which can be mounted on a substrate 443. Some secondary light can be directed via beamsplitter 423 toward spectrometer 420. The secondary light can be focused by lens 426 at a receiving port of spectrometer 420. Spectrometer 420 can be coupled to controller 430, which can determine cleanliness of sample 440 from spectral intensity data measured by spectrometer 420.

In examples, laser 410 can be a CW or pulsed tunable diode laser. Other means can also be used for cleaning sample 440 by irradiation and causing secondary radiation to be generated. Spectrometer 420 can variously be a swept spectrometer, a Fourier Transform spectrometer, or a tuned single- or multi-channel optical filtering detector. Other means can also be used for determining one or more spectral intensities of the secondary radiation. Controller can include a microprocessor executing program instructions from memory. Other means can also be used for determining cleanliness of sample 440 from the one or more spectral intensities. Sample 440 can be graphene, hexagonal boron nitride, or another 2-D material. Substrate 443 can be porous silicon nitride, another porous material, or a non-porous material. In further examples, spectrometer 420 can be positioned to receive and measure light transmitted through sample 440, instead of reflected or backscattered light.

Example Cleaning

FIGS. 5A-5D are electron images 501-504 illustrating cleaning performance on an example graphene sample. Each image is projected through a graphene sample mounted on a porous SiN substrate. The SiN substrate appears as a dark background in images 501, 503. Windows 511, 512, 531 and other windows are arranged in a hexagonal layout. Each window 511 has a diameter of about 500 nm.

Figure 5A:
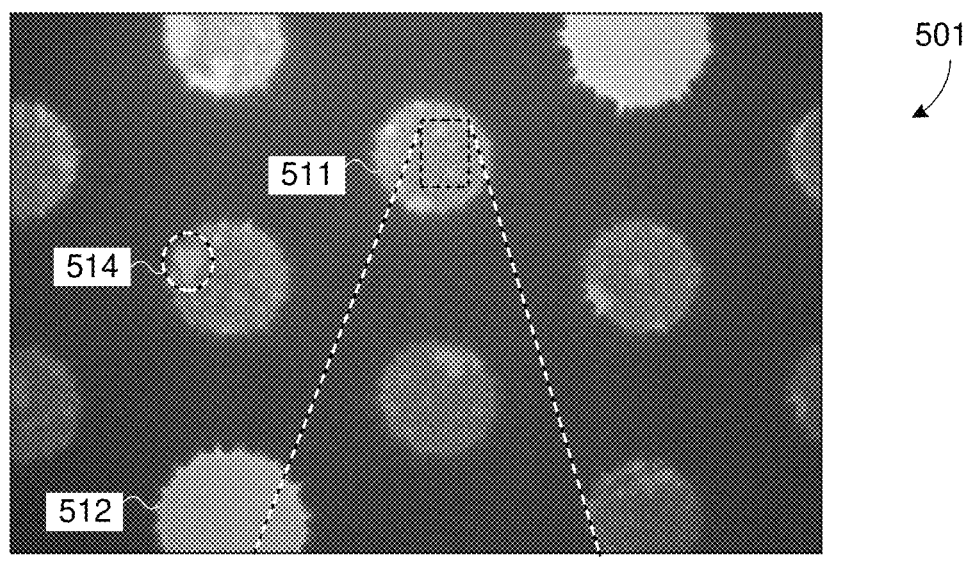
FIGS. 5A-5D are images illustrating example cleaning performance of the disclosed technologies.

FIG. 5A shows a mounted sample prior to cleaning. The mottled image of window 511 indicates presence of particulate contaminants. Region 514 is free of contaminants. The variation in initial contaminant levels demonstrates the advantage of in situ cleanliness monitoring according to the disclosed technologies, as cleaning time can be dynamically allocated to the windows where cleaning is needed, without wasting undue time irradiating windows that are already clean. For reference, window 512 is an open window not covered by graphene.

Figure 5B:
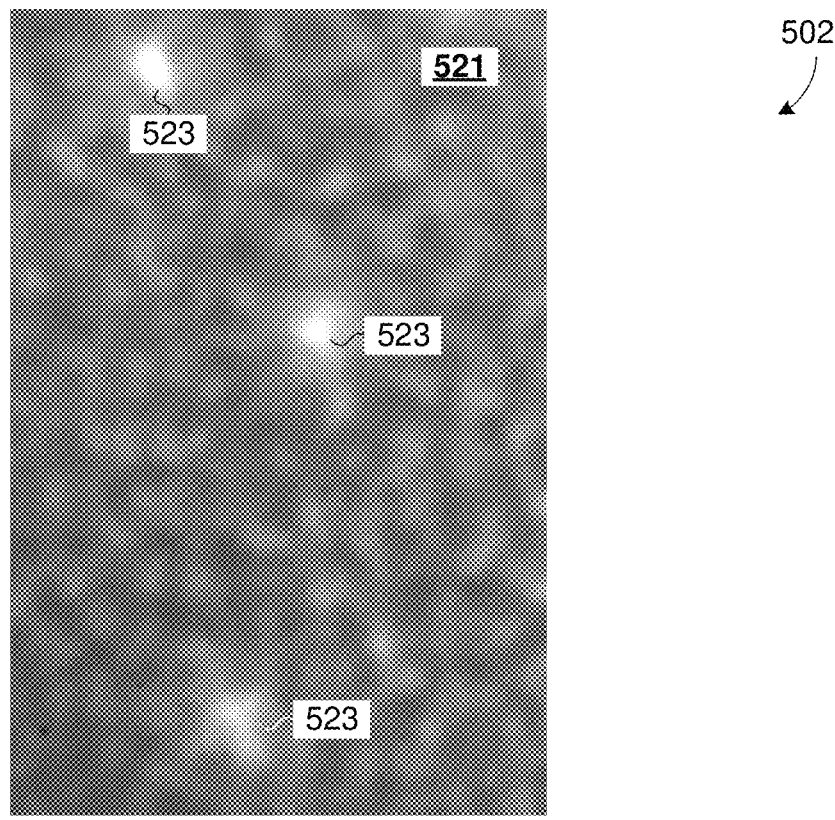

FIG. 5B shows a representative magnified portion 521 of a window such as window 511. Scattering features 523 are discernible but blurred.

Figure 5C:
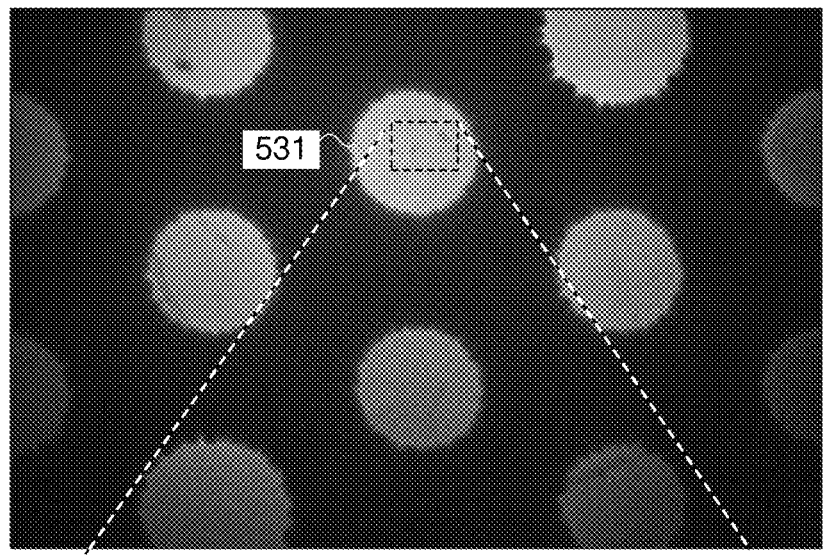
Figure 5D:
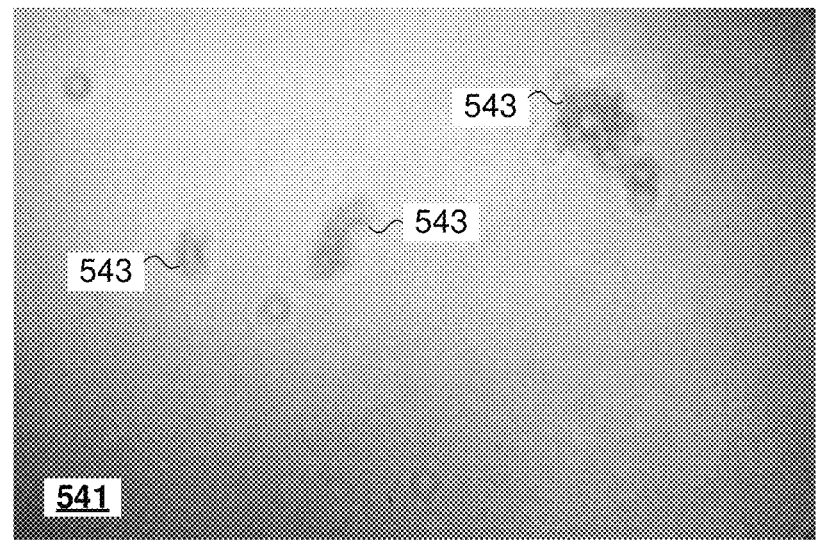

FIG. 5C shows a similar sample after some cleaning. The appearance of window 531 is noticeably clearer than window 511 of FIG. 5A, however a few spots are still discernible. FIG. 5D shows a representative magnified portion 541 of a window. Compared to FIG. 5B, structural features of molecules 543 are clearly discernible.

Example Monitoring

Figure 6:
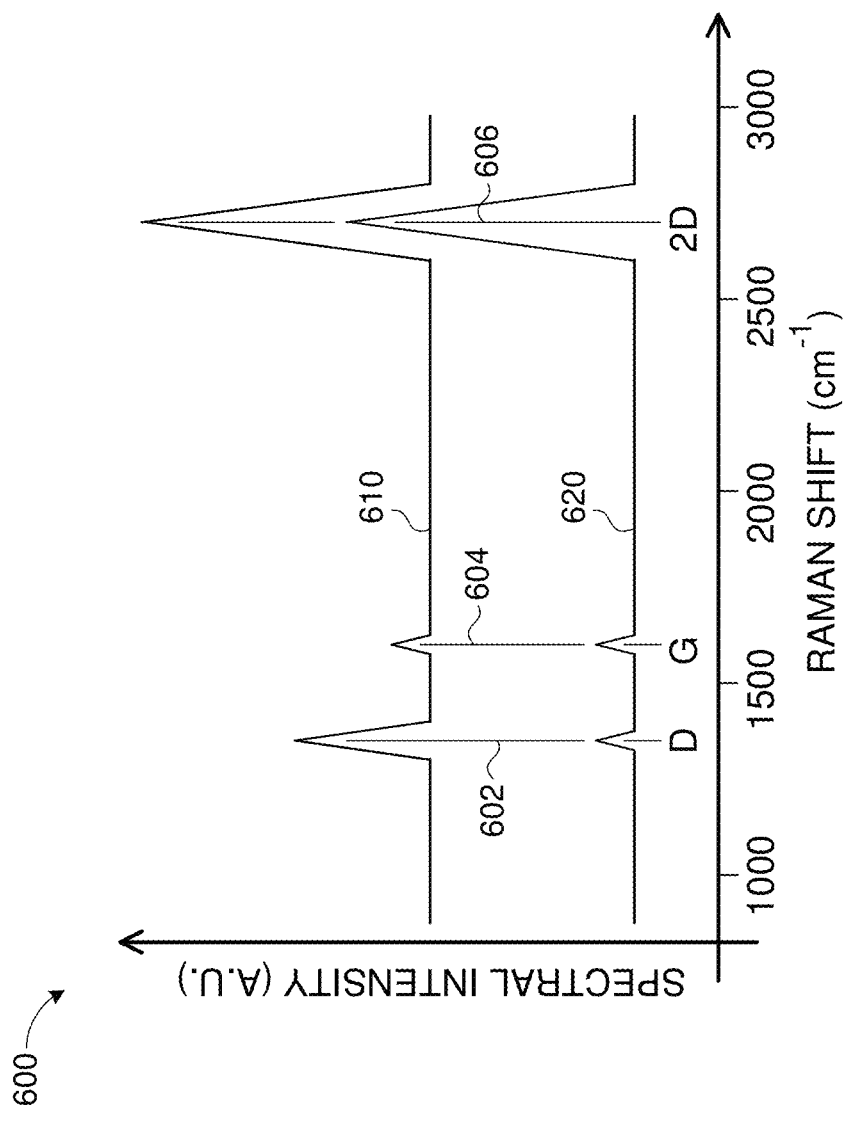
FIG. 6 is a chart illustrating example cleanliness monitoring according to the disclosed technologies.

FIG. 6 is a chart 600 illustrating an example of cleanliness monitoring. Spectra 610, 620 are Raman spectra of a given graphene sample before and after a cleaning operation, respectively. Each spectrum 610, 620 is a plot of spectral intensity as a function of Raman shift (in wavenumber units $cm^{-1}$). Spectra 610, 620 are offset from each other for clarity of illustration, but are otherwise to the same scale, with equal baseline levels. Spectral lines D (602), G (604), and 2D (606) are marked.

As illustrated, the G and 2D lines 604, 606, which are associated with graphene itself, are substantially unchanged between spectra 610, 620. However the D line 602 drops by about a factor of three from spectrum 610 to 620. The D line can be associated with a hydrocarbon bond, common to many contaminant species but absent in clean graphene. Thus, the amplitude of the D line can be an indication of an amount of contaminant present.

In varying examples, the spectral intensity of the D peak can be reported as the height of the peak in absolute units, the height above baseline, the area under the peak, the ratio of height or area of the D peak relative to another peak, or another parameter or combination associated with the D peak.

First Example Method

Figure 7:
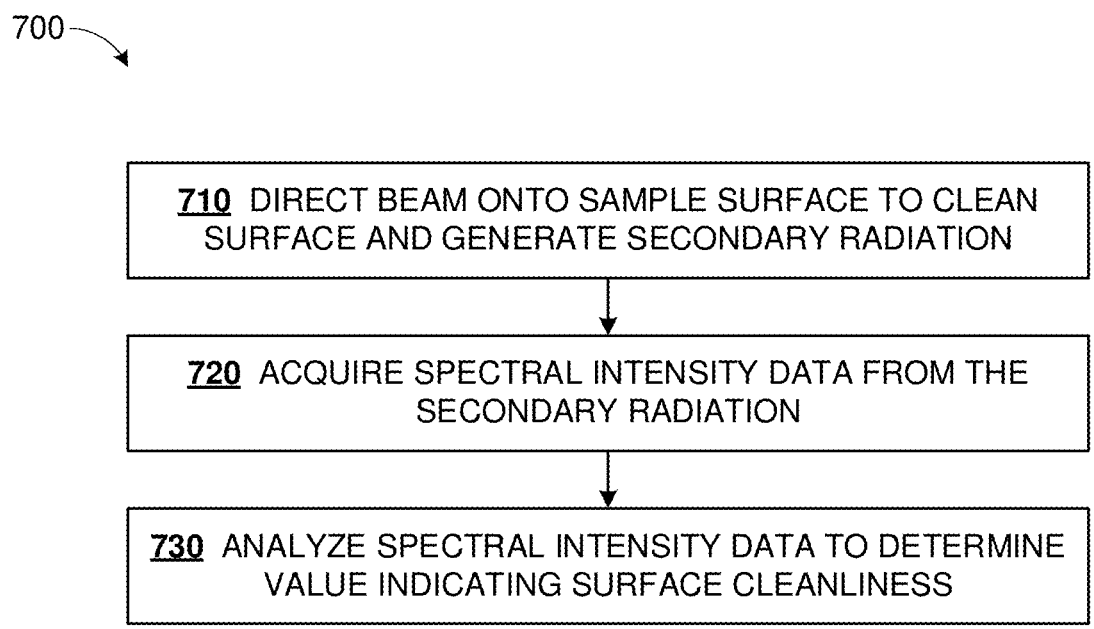
FIG. 7 is a flowchart of a first example method according to the disclosed technologies.

FIG. 7 is a flowchart 700 of a first example method for cleaning and monitoring cleanliness of a sample surface. In this method, a beam incident on the sample surface cleans the surface and generates secondary radiation. The secondary radiation is used to obtain an indication of surface cleanliness.

At process block 710, a beam is directed onto a surface of a sample to clean the surface and to generate secondary radiation. In some examples, the beam and the secondary radiation can be in the form of electromagnetic radiation, or light, but this is not a requirement and other types of beams and secondary radiation can be used. A light beam can be generated by a laser similar to 310 of FIG. 3.

At process block 720, spectral intensity data of the secondary radiation can be obtained. In some examples, the spectral intensity data can include intensity of a Raman peak associated with a contaminant species at the sample surface, but this is not a requirement and secondary radiation can contain other features associated with contaminants. Block 720 can be performed by a spectrometer similar to 320 of FIG. 3, or by a controller (330) obtaining spectral intensity data from such a spectrometer.

At process block 730, the spectral intensity data can be analyzed to obtain a value indicating cleanliness of the sample surface. Block 730 can be performed by a spectrometer (320) or by a controller (330) coupled to the spectrometer.

Numerous extensions or variations of the first method can be implemented within the scope of the disclosed technologies. In some examples, the beam of block 710 can include coherent light (e.g. from a laser) and the secondary radiation can include light generated by Raman scattering, e.g. by contaminant molecules. However, other types of beams and secondary radiation can also be used. In a further example, a beam of X-rays or electrons can ionize contaminant atoms or molecules by ejecting orbital electrons, and secondary radiation can include light at certain emission lines characteristic of the orbital energy levels of the contaminant atoms or molecules. Alternatively, a beam of electrons can experience inelastic scattering by a contaminant species, and techniques such as electron dispersion spectroscopy (EDS) or electron energy loss spectroscopy (EELS) can be used to identify and measure the contaminant species. Still further, electrons emitted from a sample irradiated by X-rays can also provide information identifying contaminant species.

Blocks 720 and 730 can be performed concurrently with block 710. In some examples, blocks 710, 720, and 730 can be performed simultaneously. In other examples, block 710 can be performed in pulses (which can allow the sample to cool down in the time between pulses), and one or both of blocks 720, 730 can be performed during the intervals between successive pulses. In further examples, process block 710 can be performed continuously, while process block 720 can be performed repetitively over successive blocks of time. To illustrate, a spectrometer can: integrate received light over a first block of time, provide corresponding spectral intensity data, and start a measurement over a second block of time. Analysis of spectral intensity data for the first block of time (block 730) can occur during or before the second block of time.

In varying examples, the value indicating surface cleanliness can be provided to a supervisory program, which can terminate cleaning, determine whether to terminate cleaning, or determine when to terminate cleaning, based upon the value. The value can be provided to a memory device (e.g. stored therein), can be provided in the form of a message transmitted over a network or bus to an operator console, or can be provided to an annunciator, for visible, audible, or other indication.

In further examples, process blocks 710, 720, 730 can be performed for multiple ROIs on the sample surface. Each ROI can correspond to a respective aperture in a substrate supporting the sample. The beam can be scanned over the ROIs in multiple passes. Each pass can traverse all of the ROIs. In some examples, a spot size of the beam can cover an entire SiN (substrate) window while, in other examples, a narrow spot size can be raster scanned over one or more windows. In further examples, a spot size of the beam can illuminate and clean multiple windows simultaneously.

In additional examples, the sample can be a monolayer or bilayer graphene membrane. The sample can be a 2-D material supported over a porous substrate.

Any of the disclosed methods, variations, or extensions can be embodied in the form of executable instructions stored on computer-readable media, such that execution of the instructions causes the respective method to be performed.

Second Example Method

Figure 8:
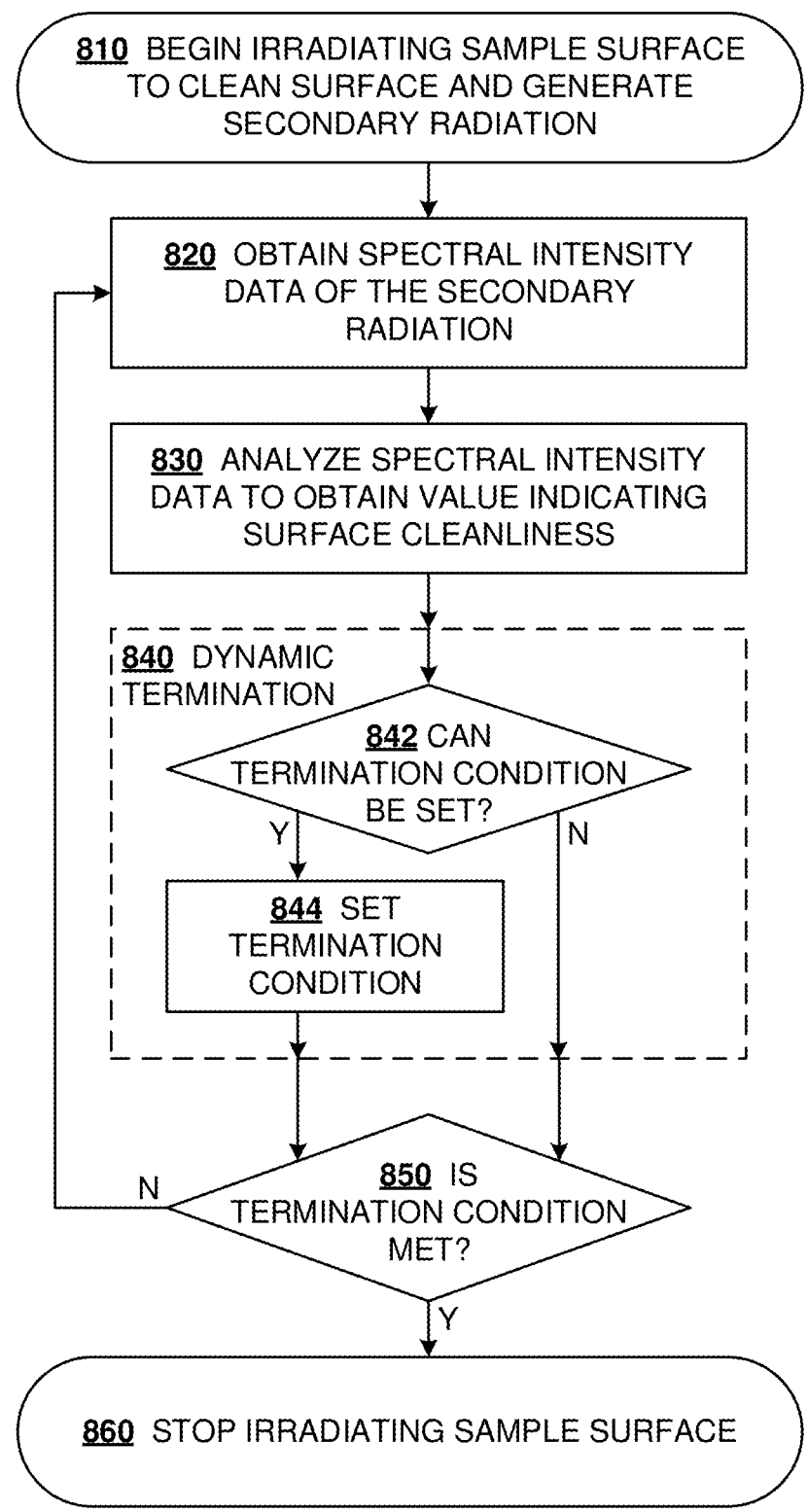
FIG. 8 is a flowchart of a second example method according to the disclosed technologies.

FIG. 8 is a flowchart 800 of a second example method. In this method cleaning is performed iteratively in multiple passes. In variations, a termination condition can be dynamically determined.

At starting block 810, irradiation of a sample surface is commenced. Irradiation can clean the surface (e.g. by heating leading to volatilization of contaminant species) and can also generate secondary radiation. Entering an iterative loop, spectral intensity data of the secondary radiation can be obtained at process block 820. At process block 830, the spectral intensity data can be analyzed to obtain a value indicating surface cleanliness.

Some examples can support dynamic termination, shown as optional block 840 with dashed outline. At decision block 842, a determination can be made whether a termination condition can be set. To illustrate, the determination can be made based on the most recent cleanliness value determined at block 830, based on a number of iterations performed so far, based on trend analysis, or based on other criteria. In case of an affirmative determination, the method can follow the Y branch from decision block 842 to block 844, where the termination condition can be set. In varying examples, the termination condition can be a logical value True, which can lead to immediate termination after the current iteration; can be a time (either an absolute or relative time) at which to terminate cleaning; or can be a cleanliness level (either an absolute level, or a level relative to noise) at which to terminate cleaning; or can be a number of additional iterations to be performed, after which cleaning can be terminated. Alternatively, if the determination at block 842 is negative (e.g. insufficient or inadequate cleanliness data), then the method can follow the N branch from block 842 to exit the dynamic termination block 840.

Accordingly, the method can reach decision block 850, with or without performance of optional block 840. At block 850, a decision can be made whether a current termination condition is met. On an affirmative determination, the method can follow the Y branch from block 850 to stop block 860, where irradiation of the sample surface can be terminated. Alternatively, if the termination condition has not been met, then the method can follow the N branch from block 850, looping back to block 820 to acquire further spectral intensity data.

Numerous extensions or variations of the second method can be implemented within the scope of the disclosed technologies. In some examples, irradiation can be performed continuously from block 810 to block 860 while, in other examples, irradiation can be pulsed in a predetermined manner to provide alternate phases of heating and cooldown. Irradiation can be continuously scanned across multiple ROIs of the sample (e.g. over respective apertures of a porous substrate). In some examples, the spectral intensity data can be averaged over multiple ROIs while, in other examples, spectral intensity data can be separately obtained for each ROI. In further examples, successive iterations of the illustrated loop (blocks 820 to 850) can be performed on a single ROI until the corresponding termination condition has been met, after which the method can be repeated on another ROI. Alternatively, successive iterations can be performed on successive ROIs, in a round-robin fashion or according to another pattern. For example, with 3 ROIs denoted A, B, C, successive iterations can be performed A-B-C-A-B-C-A . . . . Then, after ROI B has met its termination condition, successive iterations can be performed C-A-C-A . . . on the remaining ROIs. In some examples, dynamic termination block 840 can be performed on every iteration, with the termination condition being dynamically updated as more cleanliness data is gathered. Alternatively, dynamic termination block can be executed until block 844 has been performed once, and omitted thereafter. In examples with multiple ROIs, each ROI can have its own termination condition. Block 850 can default to "no" and follow the N branch if a termination condition has not been set.

Example Method Variations

Figure 9:
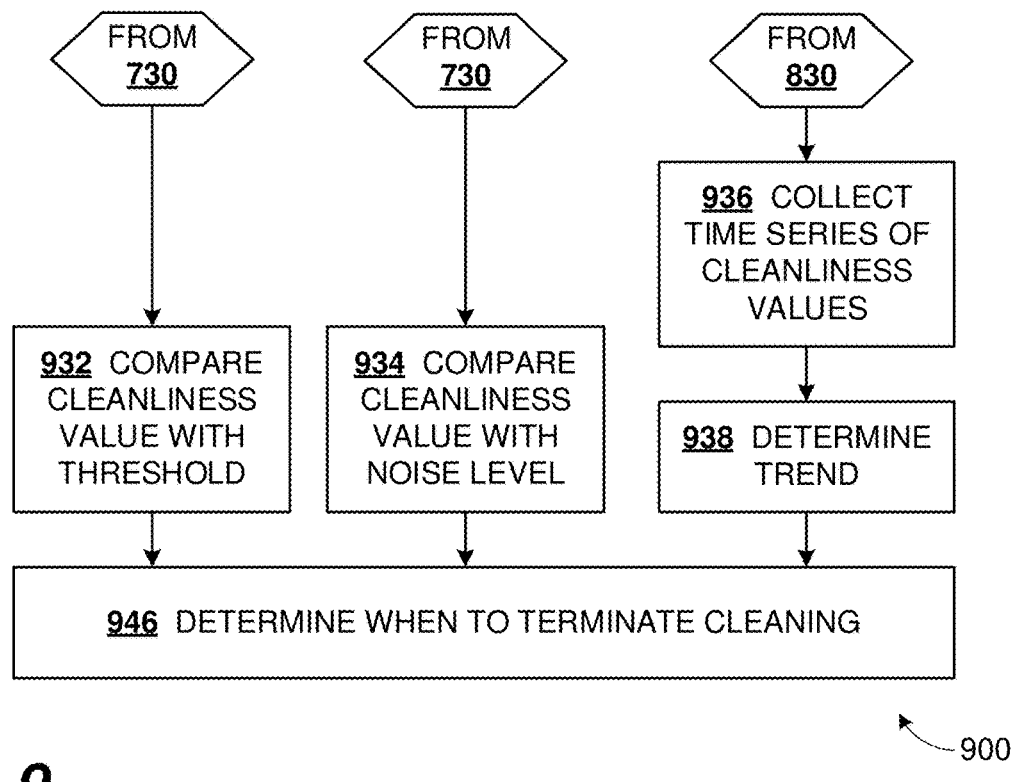
FIG. 9 is a flowchart of example method variations according to the disclosed technologies.

FIG. 9 is a flowchart 900 illustrating example method variations for determining when to terminate cleaning. For purpose of illustration, the disclosed variations are linked to FIG. 7 (block 730) or FIG. 8 (block 830), however the variations are not so limited, and can be combined with any other method disclosed herein, including various other extensions or variations.

At process block 932, a value indicating sample cleanliness can be compared with a predetermined threshold. Such a value can be obtained, e.g., at block 730 as described herein. Based on such comparison, at block 946 a determination can be made when to terminate cleaning. In some instances, a determination can be made to terminate cleaning immediately while, in other instances, a determination can be made to terminate cleaning after a predetermined time interval. That is, if the cleanliness value indicates that an amount of sample contaminant is below the predetermined threshold, then a target cleanliness level may have been reached, and cleaning can stop immediately. Alternatively, cleaning can continue for some additional time, to provide a margin of safety.

On another path, at block 934, a value indicating sample cleanliness can be compared with a noise level. Such a value can be obtained, e.g., at block 730 as described herein. Based on such comparison, at block 946 a determination can be made when to terminate cleaning, either immediately, or after some additional cleaning time. Merely as an illustration, the cleanliness value can correspond to a contaminant level at 2× the noise level. Then, based on previously acquired empirical data, a determination can be made that a target cleanliness level may be reached (or, that the cleanliness level will be below the noise level), with a probability of 98%, after another 30 minutes of cleaning. Accordingly, block 946 can determine to terminate cleaning after the 30 minutes of additional cleaning.

On a further path, at process block 946, a time series of cleanliness values can be collected. Such values can be obtained, e.g., at successive iterations of block 830 as described herein. A trend of the time series can be determined at block 938. The trend determination can variously include linear regression, curve fitting, smoothing, or extrapolation of the time series data. The trend itself can include results (e.g. coefficients or parameter values) of the trend determination. Then, at block 946, a determination can be made when to terminate cleaning. In some instances, the trend may indicate that a target cleanliness has already been reached, and a determination can be made to terminate cleaning immediately. In other instances, the trend may indicate that the target cleanliness may be reached, with a predetermined probability or confidence level, after an additional time. Then, the determination can be made to terminate cleaning after the additional time.

Numerous extensions or variations of the illustrated paths can be implemented within the scope of the disclosed technologies. Cleaning can be terminated, subsequent to block 946, according to the determination at block 946. In some examples, the method can return from block 946 to block 840 or block 850 of FIG. 8.

Example Endpointing

Figure 10:
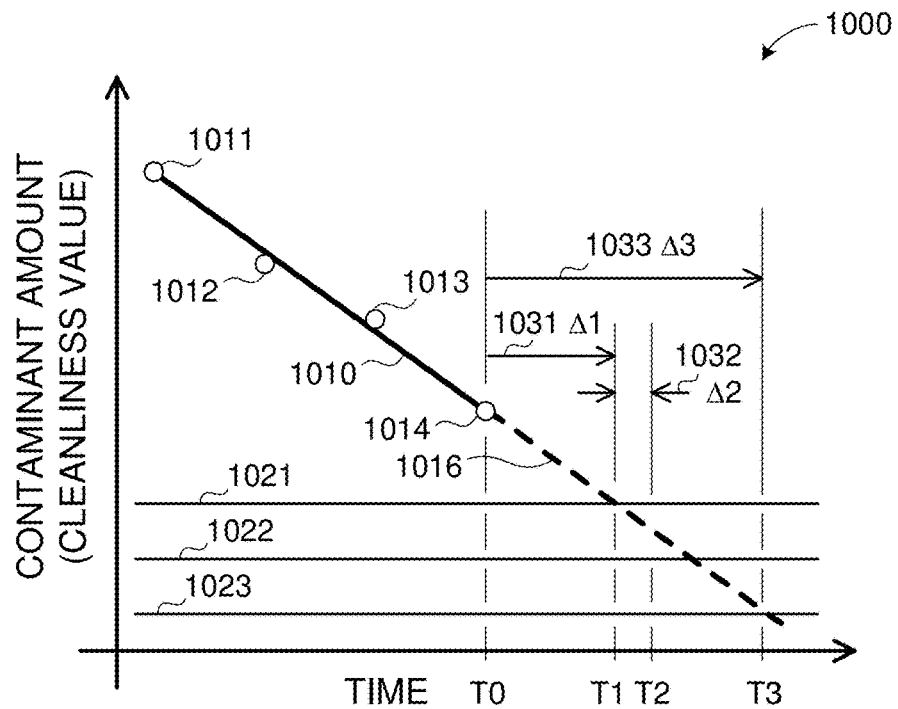
FIG. 10 is a diagram illustrating endpointing examples according to the disclosed technologies.

FIG. 10 is a chart 1000 illustrating examples of endpointing for a cleaning procedure according to the disclosed technologies. In these examples, an amount of contaminant is used as the cleanliness value, and is monitored at successive times during a cleaning procedure. Thus, the cleanliness value can be the intensity of a Raman scattering peak from a contaminant species. As illustrated, the amount of contaminant (cleanliness value) decreases with time as the sample becomes cleaner.

Chart depicts a time series of cleanliness values 1011-1014 as open circles. Each data point 1011-1014 has an abscissa along the horizontal "Time" axis indicating a representative time at which the instant cleanliness value was measured, and an ordinate along the vertical "Cleanliness" axis indicating the associated cleanliness value. As illustrated, the most recent measurement 1014 was at time T0. The time series can be obtained, for example, at block 936 of FIG. 9.

Further, based on the time series, a trend has been determined in the form of trendline 1010, shown as a solid line. In examples, the trend determination can be performed as block 938 described herein. Based on the trend, an extrapolation can be made, shown as a dashed line 1016.

A few scenarios are described with reference to cleanliness levels 1021-1023, shown as horizontal lines.

In a first scenario, cleanliness level 1021 can represent a target cleanliness value. Then, extrapolation 1015 can predict that the target cleanliness value is expected to be reached after a delay $\Delta 1$ (1031) past most recent datapoint 1014, or at time $T1=T0+\Delta 1$. Accordingly, at block 946, a determination can be made to terminate cleaning at time T1.

In a second scenario, an additional delay $\Delta 2$ (1032) can be added to account for errors in measurement, trendline determination, or extrapolation. In this scenario, a determination can be made at block 946 to terminate cleaning at time $T2=T0+\Delta 1+\Delta 2$.

In a third scenario, cleanliness level 1022 can represent a noise floor for cleanliness measurements, and cleanliness level 1023 can represent a target cleanliness level. That is, due to one or more contributing sources of noise, target cleanliness level 1023 may not be amenable to direct measurement. However, extrapolation 1015 can be used to predict that the target level 1023 is expected to be reached at a time $\Delta 3$ (1033) after T0. Accordingly, at block 946, a determination can be made to terminate cleaning at time $T3=T0+\Delta 3$.

Numerous extensions or variations of these examples can be implemented within the scope of the disclosed technologies. One or more weighting factors can be applied to data points 1011-1014. A weighting factor can vary as the margin between a data point and noise floor 1022, providing greater weight to data point 1011 as compared to data points 1012-1014. A second weighting factor can vary inversely with age of the data point, whereby most recent data point 1014 could have greater weight than points 1011-1013. One or more weighting factors can be applied to determine a weight associated with a respective data point 1011-1014 for trend determination. In some examples, time series 1011-1014 can be uniformly spaced, while in other examples variable time intervals can be used for successive measurements. A longer measurement time interval can improve accuracy of measurements close to noise floor 1022.

Example System

Figure 11A:
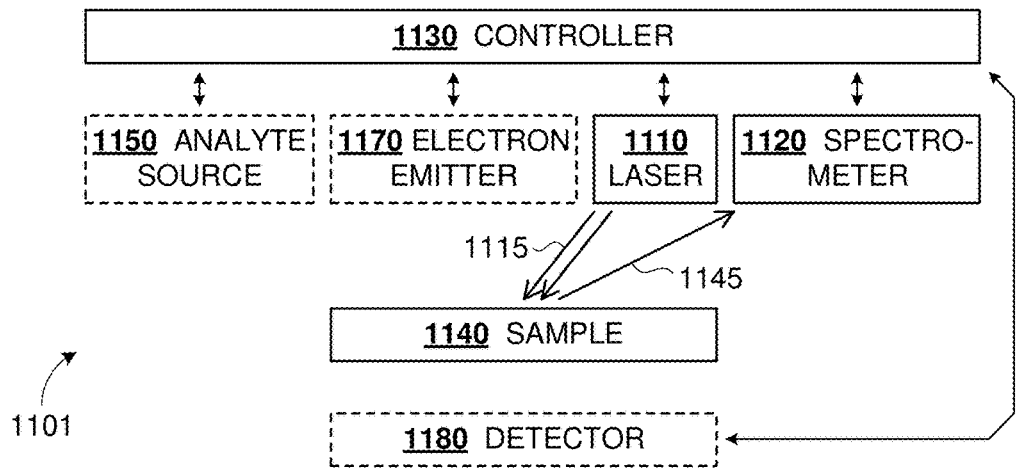
FIGS. 11A-11C are diagrams of an example system implementing the disclosed technologies for an analysis application.
Figure 11B:
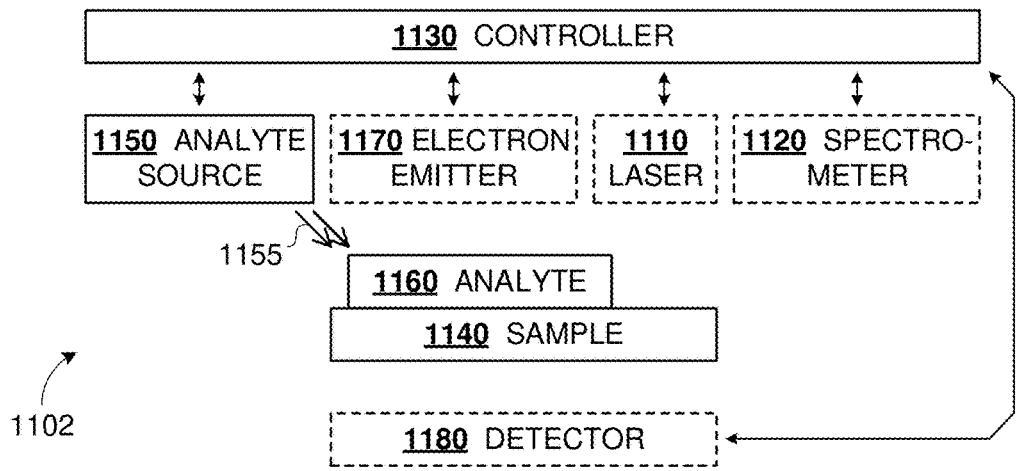
Figure 11C:
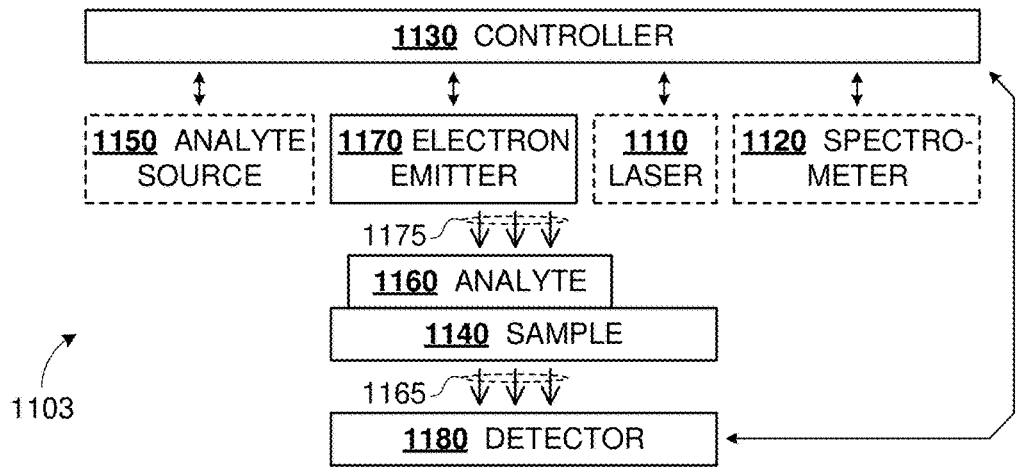

FIGS. 11A-11C are diagrams 1101-1103 of an example system, including various configurations and operating modes.

In a base configuration, the system can include means for cleaning sample 1140 by irradiation 1115 and causing secondary radiation 1145 to be generated at sample 1140. In some examples, this means can be laser 1110, which can be similar to laser 310 of FIG. 3. However, other means such as X-ray sources, electron sources, or mercury lamps can also be used. The secondary radiation can include Raman scattered light. The base configuration can also include means for determining one or more spectral intensities of secondary radiation 1145. In some examples, this means can be spectrometer 1120, which can be an optical spectrometer similar to 320 of FIG. 3. However, other means such as electron spectrometers or photographic plates can also be used. The base configuration can also include means for determining cleanliness of the sample from the one or more spectral intensities. In some examples, this means can be a hardware processor or controller 1130, which can execute program instructions or can be similar to 330 of FIG. 3. However, other means such as ADCs, DACs, amplifiers, comparators, filters, logic gates, or other discrete electronics (e.g. not executing any program instructions) can also be used. As described herein, the spectral intensities can be dependent on an amount of contaminant present in the sample.

In enhanced configurations, the illustrated system can include one or more of analyte source 1150, electron microscope 1170, or detector 1180. The enhanced configurations can support multiple modes of operation, which are variously depicted in FIGS. 11A-11C. System components active in a given operating mode are shown in solid outline, while quiescent system components are shown in dashed outline. While sample 1140 is shown in solid outline for convenience of illustration, a system covered by FIGS. 11A-11C does not generally include sample 1140 as part of the system, although it may include a load lock, a stage, or other ancillary equipment (not shown).

Starting with FIG. 11A, a system is shown in a cleaning mode of operation. As illustrated, laser 1110 can irradiate sample 1140, generating secondary radiation 1145 received by spectrometer 1120. Spectrometer 1120 can be coupled to provide spectral intensity data to controller 1130, which in turn can make a determination as to cleanliness of sample 1140. The configuration and operation associated with FIG. 11A can be generally similar to those described in context of FIGS. 3-4, FIGS. 7-8, or elsewhere herein. The double arrow 1115 can denote the presence of two components of light incident on sample 1140. In some examples, the two components can have different wavelengths, different power densities, or different timing patterns, with one component optimized for a cleaning function and another component optimized for a monitoring function.

Turning to FIG. 11B, a deposition mode of operation is shown. As illustrated, analyte source 1150 can deposit analyte 1160 onto cleaned sample 1140. In some examples, analyte 1160 can be a protein or other macromolecule. In some examples, deposition can be performed using an ion beam 1155. The double arrow 1155 can denote deposition of multiple analyte species onto a single sample. In some examples, macromolecules of analyte 1160 can be sparsely distributed over sample 1140, such that the distribution of macromolecules per aperture of sample 1140 has a mode of 1. Thereby, imaging of the analyte particles can be performed individually, without confounding by other proximate analyte particles.

FIG. 11C shows an imaging mode of operation. As illustrated, electron emitter 1170 can irradiate analyte 1160 with an electron beam 1175. Transmitted electrons 1165 can include reference electrons which have not interacted with analyte 1160 or sample 1140, and scattered electrons which have been scattered e.g. by a respective particle of analyte 1160. Reference and scattered electrons 1165 can exhibit interference between their de Broglie waves at detector 1180, which can detect a resulting interference pattern or (with phase information included) hologram.

Controller 1130 can variously interface with other system components as shown, switching between operating modes, turning components off or on, controlling component settings, monitoring components, or receiving data therefrom.

Numerous extensions or variations of the disclosed systems can be implemented within the scope of the disclosed technologies, including those described elsewhere herein.

A Generalized Computer Environment

Figure 12:
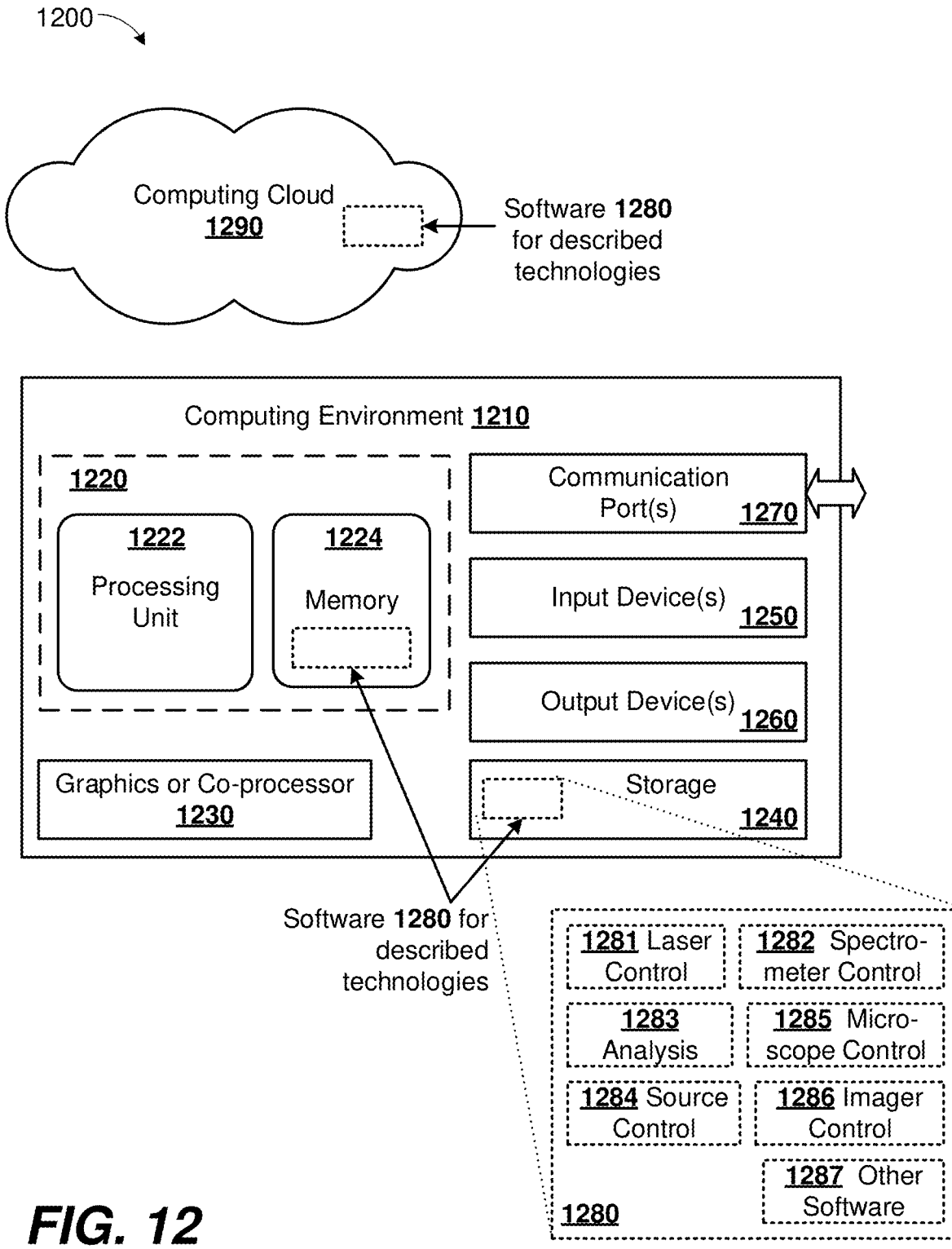
FIG. 12 illustrates a generalized example of a suitable computing environment in which embodiments, techniques, and technologies pertaining to sample cleaning, monitoring, or applications thereof can be implemented according to the disclosed technologies.

FIG. 12 illustrates a generalized example of a suitable computing system 1200 in which described examples, techniques, and technologies for concurrent sample cleaning and cleanliness monitoring can be implemented. The computing system 1200 is not intended to suggest any limitation as to scope of use or functionality of the present disclosure, as the innovations can be implemented in diverse general-purpose or special-purpose computing systems. The computing system 1200 can control a laser, a spectrometer, a stage, an analyte source, or an electron point projection microscope; or can acquire, process, output, or store measurement data.

With reference to FIG. 12, the computing environment 1210 includes one or more processing units 1222 and memory 1224. In FIG. 12, this basic configuration 1220 is included within a dashed line. Processing unit 1222 can execute computer-executable instructions, such as for control or data acquisition as described herein. Processing unit 1222 can be a general-purpose central processing unit (CPU), a processor in an application-specific integrated circuit (ASIC), or any other type of processor. In a multi-processing system, multiple processing units execute computer-executable instructions to increase processing power. Computing environment 1210 can also include a graphics processing unit or co-processing unit 1230. Tangible memory 1224 can be volatile memory (e.g., registers, cache, or RAM), non-volatile memory (e.g., ROM, EEPROM, or flash memory), or some combination thereof, accessible by processing units 1222, 1230. The memory 1224 stores software 1280 implementing one or more innovations described herein, in the form of computer-executable instructions suitable for execution by the processing unit(s) 1222, 1230. For example, software 1280 can include software 1281 for controlling a laser, software 1282 for controlling a spectrometer, software 1283 for analyzing spectral intensity data, software 1284 for controlling an analyte source, software 1285 for controlling an electron emitter, software 1286 for controlling an imaging detector, or other software 1287 (including user interface or host interface). The inset shown for software 1280 in storage 1240 can be equally applicable to software 1280 elsewhere in FIG. 12. The memory 1224 can also store control parameters, calibration data, measurement data, an spectroscopic library, training data, or other database data. The memory 1224 can also store configuration or operational data.

A computing system 1210 can have additional features, such as one or more of storage 1240, input devices 1250, output devices 1260, or communication ports 1270. An interconnection mechanism (not shown) such as a bus, controller, or network interconnects the components of the computing environment 1210. Typically, operating system software (not shown) provides an operating environment for other software executing in the computing environment 1210, and coordinates activities of the components of the computing environment 1210.

The tangible storage 1240 can be removable or non-removable, and includes magnetic disks, magnetic tapes or cassettes, CD-ROMs, DVDs, or any other medium which can be used to store information in a non-transitory way and which can be accessed within the computing environment 1210. The storage 1240 stores instructions of the software 1280 (including instructions and/or data) implementing one or more innovations described herein. Storage 1240 can also store image data (including SEM images, interference patterns, or electron holograms), measurement data, spectral intensity data, reference data, calibration data, configuration data, sample data, or other databases or data structures described herein.

The input device(s) 1250 can be a mechanical, touch-sensing, or proximity-sensing input device such as a keyboard, mouse, pen, touchscreen, or trackball, a voice input device, a scanning device, or another device that provides input to the computing environment 1210. The output device(s) 1260 can be a display, printer, speaker, optical disk writer, or another device that provides output from the computing environment 1210. Input or output can also be communicated to/from a remote device over a network connection, via communication port(s) 1270.

The communication port(s) 1270 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, acoustic, or other carrier.

A data acquisition system can be integrated into computing environment 1210, either as an input device 1250 or coupled to a communication port 1270, and can include analog-to-digital converters or connections to an instrumentation bus. An instrumentation control system can be integrated into computing environment 1210, either as an output device 1260 or coupled to a communication port 1270, and can include digital-to-analog converters, switches, or connections to an instrumentation bus.

In some examples, computer system 1200 can also include a computing cloud 1290 in which instructions implementing all or a portion of the disclosed technology are executed. Any combination of memory 1224, storage 1240, and computing cloud 1290 can be used to store software instructions and data of the disclosed technologies.

The present innovations can be described in the general context of computer-executable instructions, such as those included in program modules, being executed in a computing system on a target real or virtual processor. Generally, program modules or components include routines, programs, libraries, objects, classes, components, data structures, etc. that perform particular tasks or implement particular data types. The functionality of the program modules can be combined or split between program modules as desired in various embodiments. Computer-executable instructions for program modules can be executed within a local or distributed computing system.

The terms "computing system," "computing environment," and "computing device" are used interchangeably herein. Unless the context clearly indicates otherwise, neither term implies any limitation on a type of computing system, computing environment, or computing device. In general, a computing system, computing environment, or computing device can be local or distributed, and can include any combination of special-purpose hardware and/or general-purpose hardware and/or virtualized hardware, together with software implementing the functionality described herein.

Additional Examples

The following are additional examples of the disclosed technologies.

Example 1 is an apparatus, including: a laser arranged to irradiate a sample with incident light to clean the sample and generate secondary light; a spectrometer positioned to receive the secondary light and configured to resolve the secondary light to obtain spectral intensity data; and a controller configured to: acquire the spectral intensity data from the spectrometer; and analyze the spectral intensity data to determine a value indicating cleanliness of the sample.

Example 2 includes the subject matter of Example 1, and further specifies that at least a portion of the secondary light is generated by Raman scattering.

Example 3 includes the subject matter of any of Examples 1-2, and further specifies that the spectral intensity data comprises an intensity of a peak associated with a contaminant present at the sample, and the value is determined based on the intensity of the peak.

Example 4 includes the subject matter of any of Examples 1-3, and further specifies that the incident light is infrared light, near infrared light, visible light, or ultraviolet light.

Example 5 is a system, including: the apparatus of any of Examples 1-4; and a source configured to deposit an analyte on the cleaned sample.

Example 6 includes the subject matter of Example 5, comprising: an electron point projection microscope configured to irradiate the deposited analyte with an electron beam; and a detector positioned to record a hologram formed by interaction between the electron beam and the analyte.

Example 7 is a method, including: directing a beam onto a surface of a sample to clean the surface and to generate secondary radiation; obtaining spectral intensity data of the secondary radiation; and analyzing the spectral intensity data to establish a value indicating cleanliness of the sample surface.

Example 8 includes the subject matter of Example 7, and further specifies that the beam comprises coherent light and the secondary radiation is generated by Raman scattering.

Example 9 includes the subject matter of any of Examples 7-8, and further specifies that the spectral intensity data comprises an intensity of a peak associated with a contaminant present at the sample, and the value is determined based on the intensity of the peak.

Example 10 includes the subject matter of any of Examples 7-9, and further specifies that the obtaining and analyzing actions are performed concurrently with the directing action.

Example 11 includes the subject matter of any of Examples 7-10, comprising: based on the analyzing, determining when to terminate the cleaning of the surface.

Example 12 includes the subject matter of Example 11, and further specifies that the determining is based on comparing the value with a predetermined threshold. Example 13 includes the subject matter of any of Examples 11-12, and further specifies that the determining is based on comparing the value with a noise level.

Example 14 includes the subject matter of any of Examples 11-13, and further specifies that: the obtaining and the analyzing are repeated multiple times to generate a time series of respective values, including the value, indicating the cleanliness of the sample surface; and the determining is based on a trend of the time series.

Example 15 includes the subject matter of any of Examples 7-14, and further specifies that the directing, obtaining, and analyzing are performed for a plurality of distinct regions of interest (ROIs) on the surface of the sample.

Example 16 includes the subject matter of Example 15, and further specifies that each of the ROIs corresponds to a respective aperture in a substrate supporting the sample.

Example 17 includes the subject matter of any of Examples 15-16, and further specifies that the beam is scanned over the ROIs in multiple passes, each of the passes traversing all of the ROIs.

Example 18 includes the subject matter of any of Examples 7-17, and further specifies that the sample is a single-layer or double-layer graphene membrane.

Example 19 includes the subject matter of any of Examples 7-18, and further specifies that the sample is a two-dimensional material supported over a porous substrate.

Example 20. One or more computer-readable media storing instructions which, when executed by one or more hardware processors, actuate the one or more hardware processors to cause the method of any one of Examples 7-19 to be performed.

Example 21 is a system, including: first means for cleaning a sample by irradiation and causing secondary radiation to be generated at the sample; second means for determining one or more spectral intensities of the secondary radiation; and third means for determining cleanliness of the sample from the one or more spectral intensities.

Example 22 includes the subject matter of Example 21, and further specifies that the first means is a laser.

Example 23 includes the subject matter of any of Examples 21-22, and further specifies that the secondary radiation comprises Raman scattered light and the second means is a spectrometer.

Example 24 includes the subject matter of any of Examples 21-23, and further specifies that the third means comprises a hardware processor.

Example 25 includes the subject matter of any of Examples 21-24, and further specifies that the one or more spectral intensities are dependent on an amount of contaminant present at the sample.

General Considerations

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items. Furthermore, as used herein, the terms "or" and "and/or" mean any one item or combination of items in the phrase. Terms joined by "or" or "and/or" need not be mutually exclusive.

The systems, methods, and apparatus described herein should not be construed as limiting in any way. Instead, the present disclosure is directed toward all novel and non-obvious features and aspects of the various disclosed embodiments, alone and in various combinations and subcombinations with one another. The disclosed systems, methods, and apparatus are not limited to any specific aspect or feature or combinations thereof, nor do the disclosed systems, methods, and apparatus require that any one or more specific advantages be present or problems be solved. The technologies from any example can be combined with the technologies described in any one or more of the other examples. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "acquire," "analyze," "clean," "compare," "deposit," "determine," "direct," "establish," "generate," "irradiate," "obtain," "produce," "provide," "record," "repeat," "scan," or "traverse" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus may be referred to as "lowest", "best", "maximum," "optimum," "extremum," or the like. It will be appreciated that such descriptions are intended to indicate that a selection among a few or among many alternatives can be made, and such selections need not be lower, better, less, or otherwise preferable to other alternatives not considered.

Theories of operation, scientific principles, or other theoretical descriptions presented herein in reference to the apparatus or methods of this disclosure have been provided for the purposes of better understanding and are not intended to be limiting in scope. The apparatus and methods in the appended claims are not limited to those apparatus and methods that function in the manner described by such theories of operation.

Any of the disclosed methods can be controlled by, or implemented as, computer-executable instructions or a computer program product stored on one or more computer-readable storage media, such as tangible, non-transitory computer-readable storage media, and executed on a computing device (e.g., any available computing device, including tablets, smart phones, or other mobile devices that include computing hardware). Tangible computer-readable storage media are any available tangible media that can be accessed within a computing environment (e.g., one or more optical media discs such as DVD or CD, volatile memory components (such as DRAM or SRAM), or nonvolatile memory components (such as flash memory or hard drives)). By way of example, and with reference to FIG. 12, computer-readable storage media include memory 1224, and storage 1240. The terms computer-readable media or computer-readable storage media do not include signals and carrier waves. In addition, the terms computer-readable media or computer-readable storage media do not include communication ports (e.g., 1270).

Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network, a cloud computing network, or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in Adobe Flash, C, C++, C#, Curl, Dart, Fortran, Java, JavaScript, Julia, Lisp, Matlab, Octave, Perl, Python, Qt, R, Ruby, SAS, SPSS, SQL, WebAssembly, any derivatives thereof, or any other suitable programming language, or, in some examples, markup languages such as HTML or XML, or with any combination of suitable languages, libraries, and packages. Likewise, the disclosed technology is not limited to any particular computer or type of hardware. Certain details of suitable computers and hardware are well known and need not be set forth in detail in this disclosure.

Furthermore, any of the software-based embodiments (comprising, for example, computer-executable instructions for causing a computer to perform any of the disclosed methods) can be uploaded, downloaded, side-loaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, infrared, and optical communications), electronic communications, or other such communication means.

In view of the many possible embodiments to which the principles of the disclosed subject matter may be applied, it should be recognized that the illustrated embodiments are only preferred examples of the disclosed subject matter and should not be taken as limiting the scope of the claims. Rather, the scope of the claimed subject matter is defined by the following claims. We therefore claim all that comes within the scope and spirit of these claims.

We claim:

1. An apparatus comprising:
   a laser arranged to irradiate a sample with incident light to clean the sample and generate secondary light;
   a spectrometer positioned to receive the secondary light and configured to resolve the secondary light to obtain spectral intensity data; and
   a controller configured to:
      acquire the spectral intensity data from the spectrometer; and
      analyze the spectral intensity data to determine a value indicating cleanliness of the sample.

2. The apparatus of claim 1, wherein at least a portion of the secondary light is generated by Raman scattering.

3. The apparatus of claim 1, wherein the spectral intensity data comprises an intensity of a peak associated with a contaminant present at the sample, and the value is determined based on the intensity of the peak.

4. The apparatus of claim 1, wherein the incident light is infrared light.

5. A system comprising:
   the apparatus of claim 1; and
   a source configured to deposit an analyte on the cleaned sample.

6. The system of claim 5, further comprising:
   an electron point projection microscope configured to irradiate the deposited analyte with an electron beam; and
   a detector positioned to record a hologram formed by interaction between the electron beam and the analyte.

7. A method comprising:
   directing a beam onto a surface of a sample to clean the surface and to generate secondary radiation;
   obtaining spectral intensity data of the secondary radiation; and
   analyzing the spectral intensity data to establish a value indicating cleanliness of the sample surface.

8. The method of claim 7, wherein the beam comprises coherent light and the secondary radiation is generated by Raman scattering.

9. The method of claim 7, wherein the spectral intensity data comprises an intensity of a peak associated with a contaminant present at the sample, and the value is determined based on the intensity of the peak.

10. The method of claim 7, wherein the obtaining and analyzing actions are performed concurrently with the directing action.

11. The method of claim 7, further comprising:
    based on the analyzing, determining when to terminate the cleaning of the surface.

12. The method of claim 11, wherein the determining is based on comparing the value with a predetermined threshold.

13. The method of claim 11, wherein the determining is based on comparing the value with a noise level.

14. The method of claim 11, wherein:
    the obtaining and the analyzing are repeated multiple times to generate a time series of respective values, including the value, indicating the cleanliness of the sample surface; and
    the determining is based on a trend of the time series.

15. The method of claim 7, wherein the directing, obtaining, and analyzing are performed for a plurality of distinct regions of interest (ROIs) on the surface of the sample.

16. The method of claim 15, wherein each of the ROIs corresponds to a respective aperture in a substrate supporting the sample.

17. The method of claim 15, wherein the beam is scanned over the ROIs in multiple passes, each of the passes traversing all of the ROIs.

18. The method of claim 7, wherein the sample is a single-layer or double-layer graphene membrane.

19. The method of claim 7, wherein the sample is a two-dimensional material supported over a porous substrate.

20. One or more computer-readable media storing instructions which, when executed by one or more hardware processors, actuate the one or more hardware processors to cause the method of claim 7 to be performed.

21. A system comprising:
    first means for cleaning a sample by irradiation and causing secondary radiation to be generated at the sample;
    second means for determining one or more spectral intensities of the secondary radiation; and
    third means for determining cleanliness of the sample from the one or more spectral intensities.

22. The apparatus of claim 21, wherein the first means is a laser.

23. The apparatus of claim 21, wherein the secondary radiation comprises Raman scattered light and the second means is a spectrometer.

24. The apparatus of claim 21, wherein the third means comprises a hardware processor.

25. The apparatus of claim 21, wherein the one or more spectral intensities are dependent on an amount of contaminant present at the sample.

* * * * *

UNITED STATES PATENT AND TRADEMARK OFFICE
CERTIFICATE OF CORRECTION

| | | |
|---|---|---|
| PATENT NO. | : 12,158,372 B2 | Page 1 of 1 |
| APPLICATION NO. | : 17/833670 | |
| DATED | : December 3, 2024 | |
| INVENTOR(S) | : Joseph Christian et al. | |

It is certified that error appears in the above-identified patent and that said Letters Patent is hereby corrected as shown below:

In the Claims

In Column 24, Claim 22, Line 42, delete "apparatus" and insert -- system --, therefor.

In Column 24, Claim 23, Line 44, delete "apparatus" and insert -- system --, therefor.

In Column 24, Claim 24, Line 47, delete "apparatus" and insert -- system --, therefor.

In Column 24, Claim 25, Line 49, delete "apparatus" and insert -- system --, therefor.

Signed and Sealed this
Seventh Day of January, 2025

Derrick Brent
*Acting Director of the United States Patent and Trademark Office*